(12) United States Patent
Firnkes et al.

(10) Patent No.: US 9,805,908 B2
(45) Date of Patent: Oct. 31, 2017

(54) SIGNAL CHARGED PARTICLE DEFLECTION DEVICE, SIGNAL CHARGED PARTICLE DETECTION SYSTEM, CHARGED PARTICLE BEAM DEVICE AND METHOD OF DETECTION OF A SIGNAL CHARGED PARTICLE BEAM

(71) Applicant: ICT Integrated Circuit Testing Gesellschaft für Halbleiterprüftechnik mbH, Heimstetten (DE)

(72) Inventors: Matthias Firnkes, Walpertskirchen (DE); Stefan Lanio, Erding (DE)

(73) Assignee: Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 15/044,510

(22) Filed: Feb. 16, 2016

(65) Prior Publication Data
US 2016/0240347 A1 Aug. 18, 2016

Related U.S. Application Data

(60) Provisional application No. 62/117,613, filed on Feb. 18, 2015.

(51) Int. Cl.
*H01J 37/12* (2006.01)
*H01J 37/147* (2006.01)
*H01J 37/153* (2006.01)

(52) U.S. Cl.
CPC ..... *H01J 37/1472* (2013.01); *H01J 2237/151* (2013.01); *H01J 2237/28* (2013.01)

(58) Field of Classification Search
USPC ..... 250/306, 307, 310, 311, 396 R, 396 ML, 250/397, 399, 526
See application file for complete search history.

(56) References Cited

U.S. PATENT DOCUMENTS

| | | | | |
|---|---|---|---|---|
| 6,774,363 B2 * | 8/2004 | Fukuda | ............ | G01N 23/225 250/307 |
| 7,135,676 B2 * | 11/2006 | Nakasuji | ............ | G01N 23/225 250/307 |
| 7,183,546 B2 * | 2/2007 | Bullock | ............ | G01R 31/305 250/306 |
| 7,834,326 B2 * | 11/2010 | Kawasaki | ............ | G01N 23/20 250/310 |
| 8,618,500 B2 * | 12/2013 | Adamec | ............ | H01J 37/244 250/310 |

(Continued)

*Primary Examiner* — Bernard Souw
(74) *Attorney, Agent, or Firm* — Kilpatrick Townsend & Stockton LLP

(57) ABSTRACT

A signal charged particle deflection device for a charged particle beam device is provided. The signal charged particle deflection device includes a beam bender configured for deflecting the signal charged particle beam, wherein the beam bender includes a first electrode and a second electrode providing an optical path for the signal charged particle beam therebetween, wherein the first electrode has a first cross section in a plane perpendicular to the optical path, and the second electrode has a second cross section in the plane perpendicular to the optical path, and wherein a first part of the first cross section and a second part of the second cross section provide the optical path therebetween, and wherein the first part and the second part are different in shape.

20 Claims, 4 Drawing Sheets

(56) References Cited

U.S. PATENT DOCUMENTS

| | | | | |
|---|---|---|---|---|
| 8,658,984 B2* | 2/2014 | Makarov | ............... | H01J 49/406 |
| | | | | 250/282 |
| 8,723,117 B2* | 5/2014 | Lanio | ...................... | H01J 37/09 |
| | | | | 250/310 |
| 8,963,083 B2* | 2/2015 | Firnkes | ................... | H01J 37/10 |
| | | | | 250/306 |
| 9,035,249 B1* | 5/2015 | Frosien | ................... | H01J 37/05 |
| | | | | 250/310 |
| 9,048,068 B2* | 6/2015 | Lanio | ................. | H01J 37/1471 |
| 9,472,373 B1* | 10/2016 | Lanio | ...................... | H01J 37/28 |
| 2003/0085354 A1* | 5/2003 | Fukuda | ................ | G01N 23/225 |
| | | | | 250/310 |
| 2004/0155185 A1* | 8/2004 | Fukuda | ................ | G01N 23/225 |
| | | | | 250/310 |
| 2006/0054816 A1* | 3/2006 | Bullock | ............... | G01R 31/305 |
| | | | | 250/310 |
| 2009/0039281 A1* | 2/2009 | Kawasaki | .............. | G01N 23/20 |
| | | | | 250/396 R |
| 2011/0163229 A1* | 7/2011 | Frosien | ................... | H01J 37/05 |
| | | | | 250/310 |
| 2011/0272577 A1* | 11/2011 | Lanio | ................. | H01J 37/1471 |
| | | | | 250/307 |
| 2013/0270438 A1* | 10/2013 | Lanio | ...................... | H01J 37/09 |
| | | | | 250/310 |
| 2013/0270439 A1* | 10/2013 | Adamec | ................ | H01J 37/244 |
| | | | | 250/310 |
| 2015/0021474 A1* | 1/2015 | Firnkes | ................... | H01J 37/10 |
| | | | | 250/306 |
| 2015/0155634 A1* | 6/2015 | Bengtsson | ........... | H01Q 9/0442 |
| | | | | 343/745 |
| 2017/0003235 A1* | 1/2017 | Firnkes | ................... | H01J 37/26 |
| 2017/0018402 A1* | 1/2017 | Frosien | ................ | H01J 37/153 |

\* cited by examiner

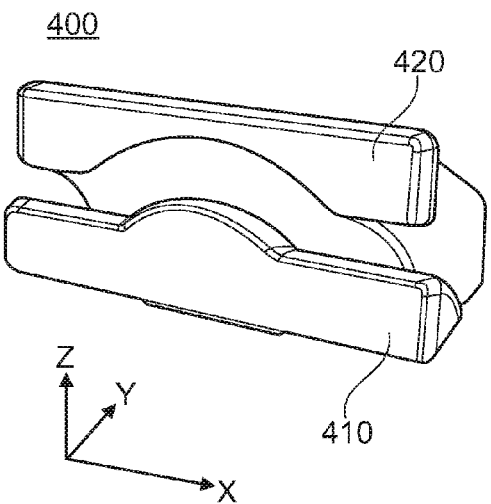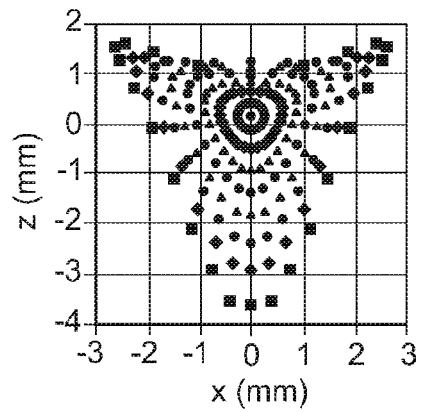
Fig. 2A  Fig. 2B
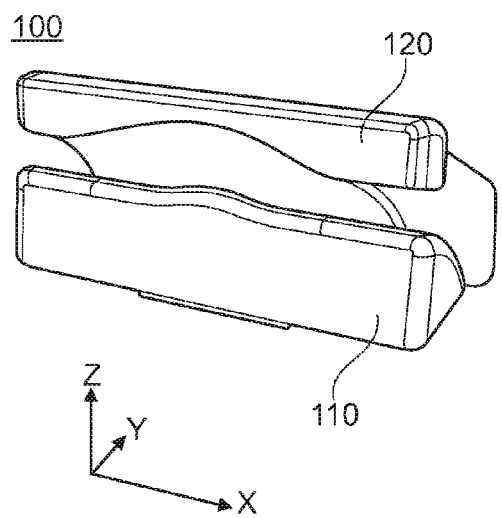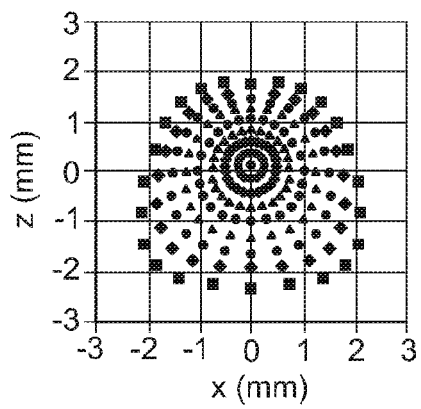
Fig. 3A  Fig. 3B

SIGNAL CHARGED PARTICLE DEFLECTION DEVICE, SIGNAL CHARGED PARTICLE DETECTION SYSTEM, CHARGED PARTICLE BEAM DEVICE AND METHOD OF DETECTION OF A SIGNAL CHARGED PARTICLE BEAM

CROSS-REFERENCE TO RELATED APPLICATIONS

This application claims priority to U.S. Provisional Application No. 62/117,613, filed Feb. 18, 2015, the entire contents of which are incorporated by reference herein for all purposes.

FIELD

Embodiments of the present disclosure relate to charged particle beam devices, for example, for inspection system applications, testing system applications, lithography system applications, defect review, critical dimensioning applications or the like. In particular, embodiments of the present disclosure relate to signal beam optics and a beam bender. Embodiments of the present disclosure specifically relate to a signal charged particle deflection device for a charged particle beam device, a signal charged particle detection system for a charged particle beam device, a charged particle beam device, and a method of detection of a signal charged particle beam in a charged particle beam device.

BACKGROUND

Signal charged particle detectors such as electron detectors can be used for charged particle beam devices, e.g. electron microscopes for electron beam inspection (EBI), defect review or critical dimension measurement, focused ion beam systems etc. Signal charged particle detectors are for example used for the detection of electrons in scanning electron microscopes. Upon irradiation of a specimen or sample by a primary charged particle beam, signal charged particles, such as secondary electrons (SE), are created, which may carry information about the topography of the specimen, its chemical constituents, its electrostatic potential and others. In some particle detectors, the signal charged particles are collected and guided to a sensor, e.g., a scintillator, a pin diode or the like. An image can be created where the gray level is proportional to the number of signal charged particles collected.

In EBI, a bright field (BF) detector can be used which may not be sensitive enough to changes in topography or surface potentials (voltage contrast—VC). VC can for example be enhanced by energy filtering the signal charged particle signal, while topography information resulting from physical defects can be enhanced using multiple sensors that collect only signal charged particles within certain ranges of take-off angles at the specimen. Topography detectors can be divided into four or more segments (with or without a central BF area), which can be read separately. The signals can then be combined (e.g. subtracted) to enhance contrast.

For multi perspective imaging, including energy filtering or angular filtering, the information carried by the signal charged particles should be conserved while the signal charged particle beam is transferred from the specimen to the signal charged particle detector. This can be done by an optical system (signal charged particle optics, e.g., SE optics) having a plurality of optical components. EBI should provide a high throughput, which can, for instance, be increased by using multiple beamlets simultaneously in one column to scan the specimen.

Aberrations can occur in signal charged particle optics, e.g., in a hemispherical beam bender or sector beam bender (SBB) used to deflect the signal charged particle beam. With increasing width of the signal charged particle beam inside the SBB, the signal charged particle beam is deformed. For multiple beamlets, the lateral position of the beamlets in the focus plane shows a considerable amount of distortion.

In view of the above, new signal charged particle deflection devices that overcome at least some of the problems in the art are beneficial. In particular, signal charged particle deflection devices providing improved focusing, angular resolution, detection efficiency, and minimized distortion of the signal charged particle beam are beneficial.

SUMMARY

In light of the above, signal charged particle deflection devices for a charged particle beam device, signal charged particle detection systems for a charged particle beam device, charged particle beam devices, and methods of detection of a signal charged particle beam in a charged particle beam device are provided. Further aspects, benefits, and features of the present disclosure are apparent from the claims, the description, and the accompanying drawings.

According to an aspect of the present disclosure, a signal charged particle deflection device for a charged particle beam device is provided. The signal charged particle deflection device includes a beam bender configured for deflecting the signal charged particle beam, wherein the beam bender includes a first electrode and a second electrode providing an optical path for the signal charged particle beam therebetween, wherein the first electrode has a first cross section in a plane perpendicular to the optical path, and the second electrode has a second cross section in the plane perpendicular to the optical path, and wherein a first part of the first cross section and a second part of the second cross section provide the optical path therebetween, and wherein the first part and the second part are different in shape.

According to another aspect of the present disclosure, a signal charged particle deflection device for a charged particle beam device is provided. The signal charged particle deflection device includes a beam bender configured for deflecting the signal charged particle beam, the beam bender having an entry portion for the signal charged particle beam and an exit portion for the signal charged particle beam; and one or more apertures having a substantially triangularly shaped passage area for the signal charged particle beam, wherein at least one aperture of the one or more apertures is positioned at the entry portion or the exit portion of the beam bender.

According to still another aspect of the present disclosure, a signal charged particle detection system for a charged particle beam device is provided. The signal charged particle detection system includes a beam splitter for separating a primary charged particle beam and a signal charged particle beam formed upon impact on a specimen; a signal charged particle deflection device according to the embodiments described herein; a focusing lens for focusing the signal charged particle beam; and at least one detection element for detecting the signal charged particle beam.

According to yet another aspect of the present disclosure, a charged particle beam device, and in particular an electron microscope for electron beam inspection having a signal charged particle deflection device according to the embodiments described herein is provided.

According to an aspect of the present disclosure, a method of detection of a signal charged particle beam in a charged particle beam device is provided. The method includes: separating a signal charged particle beam from a primary charged particle beam by means of a beam splitter; deflecting the signal charged particle beam by means of a beam bender, wherein the beam bender includes a first electrode and a second electrode providing an optical path for the signal charged particle beam therebetween, wherein the first electrode has a first cross section in a plane perpendicular to the optical path, and the second electrode has a second cross section in the plane perpendicular to the optical path, and wherein a first part of the first cross section and a second part of the second cross section provide the optical path therebetween, and wherein the first part and the second part are different in shape; and focusing the signal charged particle beam on at least one detection element by means of a focusing lens.

According to another aspect of the present disclosure, a method of detection of a signal charged particle beam in a charged particle beam device is provided. The method includes: separating a signal charged particle beam from a primary charged particle beam by means of a beam splitter; deflecting the signal charged particle beam by means of a beam bender; and focusing the signal charged particle beam on at least one detection element by means of a focusing lens, wherein the signal charged particle beam enters the beam bender at an entry portion of the beam bender and exits the beam bender at an exit portion of the beam bender, and wherein the signal charged particle beam at least one of enters or exits the beam bender through one or more apertures having a substantially triangularly shaped passage area for the signal charged particle beam.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. It includes method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following:

FIG. 2A shows a perspective view of a first electrode and a second electrode of a sector beam bender;

FIG. 2B shows a cross-section of a signal charged particle beam after the sector beam bender of FIG. 2A;

FIG. 3A shows a perspective view of a first electrode and a second electrode of a beam bender according to embodiments described herein;

FIG. 3B shows a cross-section of a signal charged particle beam having been through the beam bender of FIG. 3A according to embodiments described herein;

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as a charged particle beam device including the detection of signal charged particles such as secondary electrons or backscattered electrons. However, other types of charged particles, e.g. positive ions, could be used.

A "specimen" as referred to herein, includes, but is not limited to, semiconductor wafers, semiconductor workpieces, and other workpieces such as memory disks and the like. Embodiments of the disclosure may be applied to any workpiece on which material is deposited or workpiece which is structured. A specimen can include a surface to be structured or on which layers are deposited, an edge, e.g., a bevel.

Spherical or sector beam benders (SBB) are devices which can combine deflection and stigmatic focusing of a charged particle beam. Such devices can, for example, be used in EBI columns to couple signal charged particles out of the column into signal charged particle optics for further manipulation and detection. Aberrations can occur, e.g., in a sector beam bender used to deflect the signal charged particle beam. As an example, a hexapole component of the electric field can introduce 3-fold aberrations in the signal charged particle beam (e.g., SE bundle) passing the sector beam bender. With increasing width of the signal charged particle beam inside the sector beam bender, an increasing amount of hexapole component deforms the signal charged particle beam.

Figure 4:
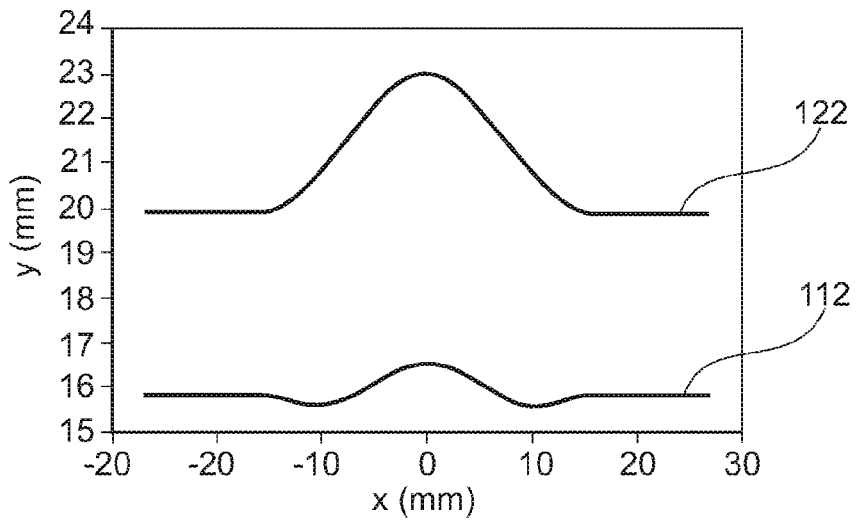
FIG. 4 shows mathematical functions defining the first cross section and the second cross section of the beam bender according to embodiments described herein.
Figure 5:
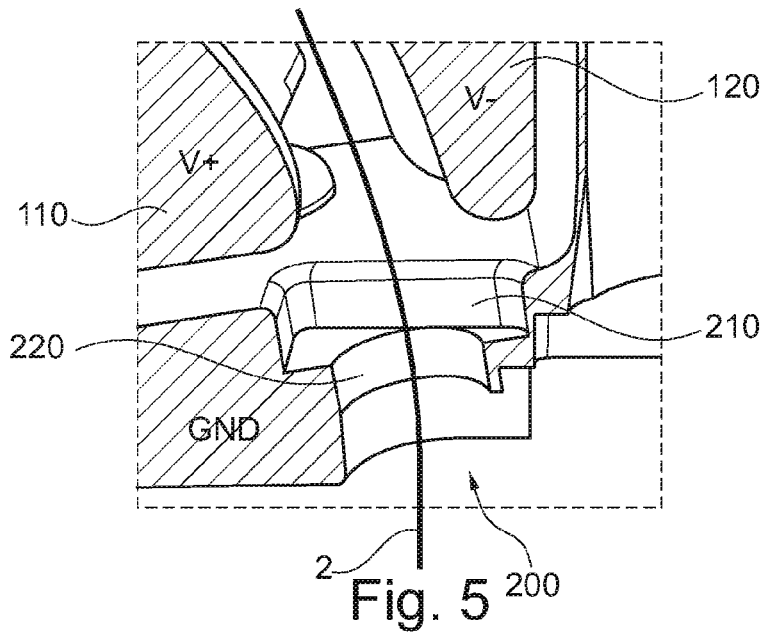
FIG. 5 shows an entry portion of a beam bender according to embodiments described herein.
Figure 6:
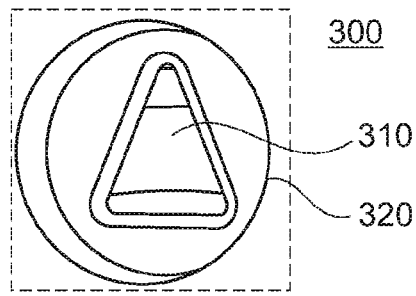
FIG. 6 shows an exit portion of a beam bender according to embodiments described herein.

The signal charged particle deflection device of the present disclosure can reduce or compensate a hexapole component of electric fields by providing at least one of differently shaped electrodes (e.g., FIGS. 3A, 3B and 4) and an aperture having a substantially triangular shaped passage area for the signal charged particle beam (e.g., FIGS. 5 and 6). The signal charged particle deflection device can in particular reduce or compensate at least one of a hexapole component between two electrodes of the beam bender of the signal charged particle deflection device (intrinsic hexapole) and the hexapole component of fringe fields e.g. at least one of an entrance and exit of the beam bender. The signal charged particle deflection device can also be referred to as "low hexapole signal charged particle deflection device". In particular, the beam bender of the signal charged particle deflection device can also be referred to as "low hexapole beam bender" or "low hexapole SBB".

The signal charged particle deflection device of the present disclosure can improve focusing, angular resolution and detection efficiency, and can minimize distortion of the signal charged particle optics. Embodiments of the present disclosure are in particular beneficial when using different landing energies of the primary charged particles on the specimen. In view of this, the present disclosure provides an increased flexibility in the use of charged particle beam devices.

Figure 1:
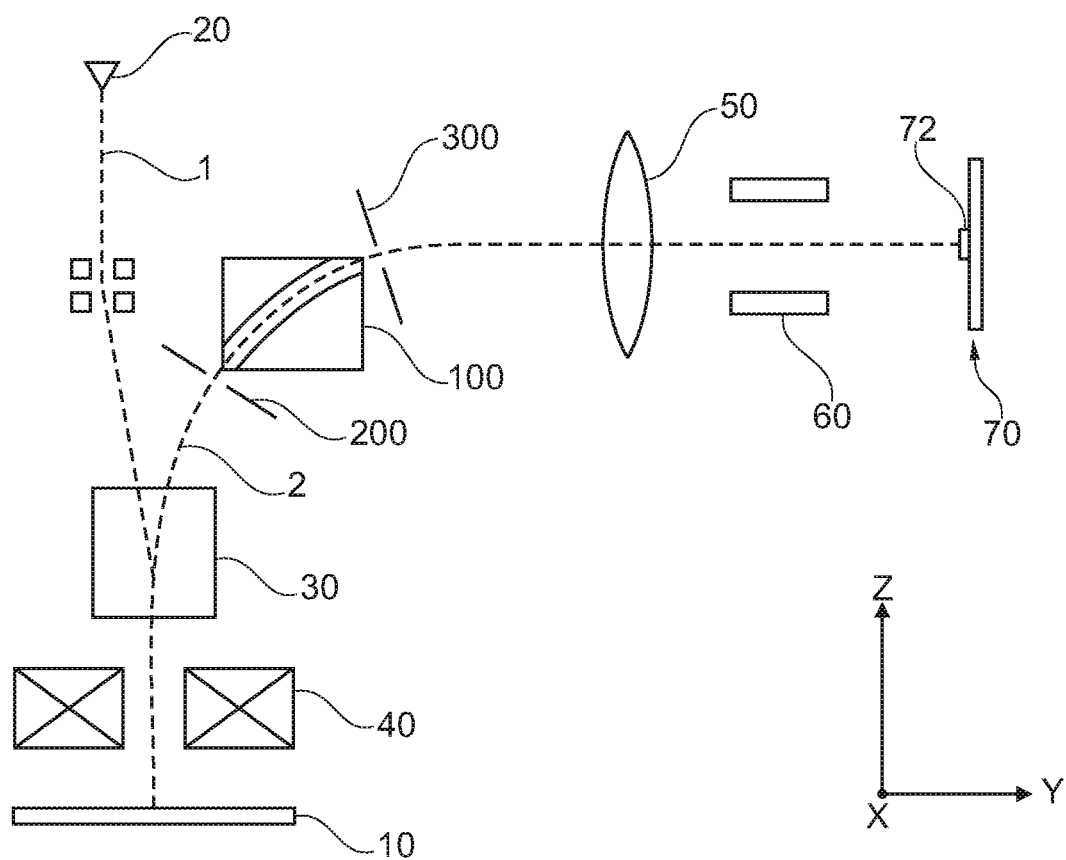
FIG. 1 shows a schematic view of a charged particle beam device having a signal charged particle deflection device according to embodiments described herein.

FIG. 1 shows a schematic view of a charged particle beam device having a signal charged particle detection system according to embodiments described herein. The charged particle beam device can for example be an electron microscope for electron beam inspection.

The signal charged particle detection system includes a beam splitter 30 for separating a primary charged particle beam 1 and a signal charged particle beam 2 formed upon impact on a specimen 10; a signal charged particle deflection device according to the embodiments described herein; a focusing lens 50 for focusing the signal charged particle beam 2; and at least one detection element 72 for detecting the signal charged particle beam 2.

The charged particle beam device includes a charged particle source 20 producing the primary charged particle beam 1 which is directed towards the specimen 10 through an objective lens 40. Signal charged particles, such as secondary electrons (SE), released from or backscattered from the specimen 10 form the signal charged particle beam 2 carrying information about the specimen 10. The information can include information about the topography of the specimen 10, chemical constituents, electrostatic potential, and others.

The signal charged particle beam 2 is separated from the primary charged particle beam 1 by means of the beam splitter 30 and enters the signal charged particle deflection device according to the embodiments described herein. The signal charged particle deflection device can include the beam bender 100, one or more apertures, e.g., a first aperture 200 and a second aperture 300, or any combination thereof.

The signal charged particle deflection device of the present disclosure can reduce or compensate a hexapole component of electric fields by providing at least one of differently shaped electrodes (e.g., FIGS. 3A, 3B and 4) and an aperture having a substantially triangular shaped passage area for the signal charged particle beam (e.g., FIGS. 5 and 6).

Referring to FIGS. 3A, 3B and 4, according to some embodiments, which can be combined with other embodiments described herein, the signal charged particle deflection device for the charged particle beam device includes the beam bender 100 configured for deflecting the signal charged particle beam, wherein the beam bender 100 includes a first electrode 110 and a second electrode 120 providing an optical path for the signal charged particle beam therebetween. The first electrode 110 has a first cross section in a plane perpendicular to the optical path, and the second electrode 120 has a second cross section in the plane perpendicular to the optical path. A first part of the first cross section and a second part of the second cross section provide the optical path therebetween. The first part and the second part can be different in shape. As an example, the first part and the second part can have qualitatively different shapes.

According to some embodiments, which can be combined with other embodiments described herein, the first part of the first cross section and the second part of the second cross section can also be referred to as "first contour portion" and "second contour portion", respectively. As used throughout the specification, the term "contour" is to be understood as a profile or border line, e.g., of the first cross section and the second cross section.

Referring to FIGS. 5 and 6, according to further embodiments, which can be combined with other embodiments described herein, the beam bender 100 has an entry portion for the signal charged particle beam and an exit portion for the signal charged particle beam; and one or more apertures, such as the first aperture 200 and the second aperture 300, having a substantially triangularly shaped passage area for the signal charged particle beam, wherein at least one aperture of the one or more apertures is positioned at the entry portion or the exit portion of the beam bender.

In shaping the electrodes of the beam bender and/or providing the one or more apertures, the signal charged particle deflection device of the present disclosure can reduce or compensate a hexapole component of electric fields. The signal charged particle deflection device of the present disclosure can improve focusing, angular resolution and detection efficiency, and can minimize distortion of the signal charged particle optics.

Turning again to FIG. 1, the beam bender 100 deflects the signal charged particle beam 2 towards a focusing lens 50. The focusing lens 50 focuses the signal charged particle beam 2 on the detection element 72 or sensor (scintillator, pin diode etc.) of a detector assembly 70. A deflector 60 can be provided between the focusing lens 50 and the detector assembly 70, e.g., to adjust a path of the signal charged particle beam 2 towards the detector assembly 70. This improves the alignment of the signal charged particle beam 2 to an optical axis of the signal charged particle optics.

FIG. 2A shows a perspective view of a section of a sector beam bender 400. FIG. 2B shows a cross-section of a signal charged particle beam having passed through the sector beam bender 400 of FIG. 2A.

A sector beam bender 400 (also referred to as "SBB") as shown in FIG. 2A is a device which can combine deflection and stigmatic focusing of a charged particle beam. The sector beam bender 400 has a first electrode 410 and a second electrode 420, which may define an optical path for the signal charged particle beam therebetween. The portions of the first electrode 410 and the second electrode 420 that define the optical path have the same shape, and have in particular the same qualitative shape. As an example, the portions of the first electrode 410 and the second electrode 420 that define the optical path have a spherical shape.

Such a sector beam bender 400 can be used in EBI columns to couple signal charged particles out of the column into a signal charged particle optics, e.g., for further manipulation and detection. Hexapole components of the electric field can introduce 3-fold aberrations in the signal charged particle beam (e.g., SE bundle) passing the sector beam bender 400. The influence of the hexapole component on the signal charged particle beam can get stronger the further off-axis the signal charged particles pass the sector beam bender 400, resulting in a distortion or deformation of the signal charged particle beam, as it is shown in FIG. 2B.

As an example, for topography detection, such a deviation of a cross section of the signal charged particle beam from a circular shape (circular cross section) is an issue. Here, the signal charged particle beam could diverge before it hits a separation electrode to get e.g., angular information on different detectors. In view of this, a deformation of the signal charged particle beam can deteriorate angular resolution and intensity uniformity on the different detectors. In multi-beamlet detection, several beamlets pass the sector beam bender 400 and form an image (e.g., an array of cross-overs), which can be magnified on a detector array or similar. Here, the regular square pattern of beamlets having passed through the sector beam bender 400 is distorted and focus uniformity is deteriorated, compared to the signal charged particle deflection device of the present disclosure.

The secondary charged particle deflection device of the present disclosure can reduce or compensate a hexapole component of an electric field. In particular, the signal charged particle deflection device of the present disclosure can reduce or compensate at least one of a hexapole component between two electrodes of the beam bender (intrinsic hexapole) and the hexapole component of fringe fields, e.g., at least one of an entrance and exit of the beam bender. As an example, the signal charged particle beam deflection device can reduce the hexapole component of a sample beamlet by 88%, and a circle of least confusion can for example be reduced by 65% from, e.g., 0.74 to 0.26 mm.

FIG. 3A shows a perspective view of a section of a beam bender 100 according to embodiments described herein. FIG. 3B shows a cross-section of a signal charged particle beam having passed through the beam bender 100 of FIG. 3A. FIG. 4 shows a first mathematical function 112, e.g., a polynomial function, defining a first cross section and a second mathematical function 122, e.g., a Gaussian function, defining a second cross section of electrodes of the beam bender 100 according to embodiments described herein. The beam bender 100 can be a sector beam bender (SBB).

According to some embodiment, which can be combined with other embodiments described herein, the signal charged particle deflection device for the charged particle beam device includes the beam bender 100 configured for deflecting the signal charged particle beam, wherein the beam bender 100 includes a first electrode 110 and a second electrode 120 providing an optical path for the signal charged particle beam therebetween, wherein the first electrode 110 has a first cross section in a plane perpendicular to the optical path, and the second electrode 120 has a second cross section in the plane perpendicular to the optical path, and wherein a first part of the first cross section and a second part of the second cross section provide the optical path therebetween, and wherein the first part and the second part are different in shape, in particular wherein the first part and the second part have qualitatively different shapes. The first electrode 110 can be referred to as "inner electrode", and the second electrode 120 can also be referred to as "outer electrode".

As an example, the first electrode 110 can be configured to be biased to a first potential, e.g., a positive potential, and the second electrode 120 can be configured to be biased to a second potential, e.g., a negative potential. The first potential and the second potential can be configured for stigmatic focusing.

According to some embodiments, the optical path can be a trajectory along which the signal charged particles travel when they pass the beam bender 100. The optical path may be adjusted by the electric field provided between the first electrode 110 and the second electrode 120. As an example, the first potential and the second potential may be selected such that the signal charged particles are deflected to follow the optical path when passing through the beam bender 100. Within the beam bender 100, the optical path can particularly be a non-linear optical path. The optical path can be provided (or defined) in a substantially 2-dimensional plane, e.g., the y-z-plane as shown in FIG. 3A. It is to be understood that the signal charged particle beam can have an extension in a direction perpendicular to the 2-dimensional plane, e.g., in the x-direction (FIG. 3B), while travelling along the optical path provided or defined in the substantially 2-dimensional plane.

The first electrode 110 has a first cross section in a plane perpendicular to the optical path, and the second electrode 120 has a second cross section in the plane perpendicular to the optical path. Examples for the first cross section and the second cross section are shown in FIG. 4. In particular, a first mathematical function 112, such as a polynomial, defining the first cross section and a second mathematical function 122, such as a Gaussian function, defining the second cross section are shown. The plane can be a plane perpendicular to the optical path, i.e., when the optical path is defined in the y-z-plane, the plane of the first cross section and the second cross section can for example be the x-y-plane as shown in FIG. 4. As an example, starting in the x-y-plane and rotating the first cross section and the second cross section of FIG. 4 around the x-axis leads to electrode surfaces as shown in FIG. 3A. In some implementations, the first cross section and the second cross section can be rotated around the x-axis by an amount in the range of 40° to 120°, and specifically by an amount in the range of 60° to 90°. As an example, the first cross section and the second cross can be rotated by about 70° or about 80° to obtain the electrode surfaces.

The optical path can be provided or defined between a first part of the first cross section and a second part of the second cross section. As an example, when considering a rotation of the first cross section and the second cross section as mentioned above to form the electrode surfaces, the first part can correspond to a first surface area of the first electrode 110, and the second part can correspond to a second surface area of the second electrode 120. In other words, the optical path can be provided or defined between the first surface area and the second surface area. The first part or first surface area can be provided to face the second part or second surface area. In some implementations, the first part and the second part can define a signal charged particle region between the first electrode 110 and the second electrode 120 in a direction perpendicular to the optical path.

As an example, the first part and the second part can correspond to an extension, e.g., a maximum extension, of the signal charged particle beam in the direction perpendicular to the 2-dimensional plane in which the optical path is defined, e.g., in the x-direction (FIG. 3B). In some implementations, the signal charged particle beam can be centered at a center point in a direction perpendicular to the optical path. The center point can for example be x=0. The first part and the second part can extend between a first limit point and a second limit point, e.g., with the center point being provided (e.g., centered) between the first limit point and the second limit point. The first limit point can for example be at x=−15 mm, and the second limit point can for example be at x=15 mm. Beyond the first limit point and the second limit point, e.g., for x<−15 mm and x>15 mm, y can be held constant, as shown in FIG. 4.

According to some embodiments, edges of at least one of the first electrode 110 and the second electrode 120, at least one of the first limit point and the second limit point, can be rounded. Rounded edges means an electric field enhancement can be reduced or even avoided.

The first part of the first cross section and the second part of the second cross section are different in shape. In particular, the first part and the second part have qualitatively different shapes. As an example, the first part and the second part are not congruent or superposable. In particular, as used throughout the specification, the term "qualitatively different shapes" may refer to non-congruent or non-superposable shapes. In some implementations, a distance between the first part or first surface area of the first electrode 110 and the second part or second surface area of the second electrode 120 varies or changes in a direction perpendicular to the optical path. In other words, a distance between the first part or first surface area of the first electrode 110 and the second part or second surface area of the second electrode 120 is not constant. The distance can for example be defined as a distance in the plane in which the optical path is provided or defined.

According to some embodiments, the distance between the first part or first surface area of the first electrode 110 and the second part or second surface area of the second electrode 120 at the center point can be in a range of 1 to 10 mm, specifically in a range of 4 to 8 mm, and can more specifically be about 6.5 mm. In some implementations, the distance between the first part or first surface area of the first electrode 110 and the second part or second surface area of the second electrode 120 varies or changes along the x-axis (FIG. 4) within a range of ±4 mm, and specifically in a range of ±2.5 mm, with respect to the distance at the center point.

According to some implementations, the first part of the first cross section and the second part of the second cross section are configured for minimizing a hexapole component of an electric field between the first electrode 110 and the second electrode 120. As an example, the hexapole component between the first electrode 110 and the second electrode 120 can be influenced by varying the shape of the first electrode 110 and the second electrode 120, which can be defined by two 2-dimensional mathematical functions, such as the first mathematical function 112 and the second mathematical function 122 (FIG. 4).

In some implementations, the first part of the first cross section is defined by the first mathematical function 112, e.g., a polynomial, and in particular a sixth order polynomial. At least a portion of an electrode surface of the first electrode 110, e.g., the first surface area, can be defined by a rotation of the polynomial around a first axis, in particular by a rotation in a range of about 60° to 90° around the first axis or by a rotation of about 90° around the first axis. The first axis can be the x-axis shown in FIG. 3A.

In some implementations, the second part of the second cross section can be defined by the second mathematical function 122, e.g., an exponential function, and in particular a Gaussian function. At least a portion of an electrode surface of the second electrode, e.g., the second surface area, can be defined by a rotation of the exponential function around a second axis, in particular by a rotation in a range of about 60° to 90° around the second axis or by a rotation of about 90° around the second axis. The second axis can correspond to, or is, the first axis, and can in particular be the x-axis.

By providing the first electrode 110 and the second electrode 120, particularly the intrinsic hexapole can be minimized. The first mathematical function 112 and the second mathematical function 122 can be defined between the first limit point, e.g., x=−15 mm, and the second limit point, e.g., x=15 mm. Beyond the first limit point and the second limit point, e.g., for x<−15 mm and x>15 mm, y can be held constant, as shown in FIG. 4. The edges at the first limit point and the second limit point, e.g., at x=±15 mm, can be rounded to avoid electric field enhancement. The mathematical functions (or electrodes) may be different from the mathematical functions shown in FIG. 4, with similar or identical effects on hexapole compensation. As an example, the first mathematical function 112 can be scaled in y-direction with a factor S1 and/or the second mathematical function 122 can be scaled with a factor S2. As an example, S1 and S2 may be between 0.9 and 1.1. In some embodiments, S1 and S2 may be different from each other.

FIG. 5 shows an entry portion of a beam bender according to embodiments described herein. FIG. 6 shows an exit portion of a beam bender according to embodiments described herein.

According to some embodiments, which can be combined with other embodiments described herein, the signal charged particle deflection device includes a beam bender configured for deflecting the signal charged particle beam, the beam bender having an entry portion for the signal charged particle beam and an exit portion for the signal charged particle beam; and one or more apertures having a substantially triangularly shaped passage area for the signal charged particle beam, wherein at least one aperture of the one or more apertures is positioned at the entry portion or the exit portion of the beam bender. The hexapole component of a fringe field, i.e., an influence of the hexapole component on the signal charged particle beam, can be reduced by shaping the one or more apertures in a triangular fashion.

In some implementations, a first aperture 200 of the one or more apertures is positioned at the entry portion of the beam bender and a second aperture 300 of the one or more apertures is positioned at the exit portion of the beam bender. The hexapole of the electric fringe field can be reduced by shaping at least one of the first aperture 200 (e.g., an entrance aperture) and the second aperture 300 (e.g., an exit aperture) in a triangular fashion.

According to some embodiments, at least one aperture of the one or more apertures can be configured as a third electrode of the beam bender. As an example, the first aperture 200 positioned at the entry portion of the beam bender can be configured as the third electrode. The third electrode can be a grounded electrode. In some examples, the first aperture 200 can be integrally formed with the third electrode.

According to some embodiments, the substantially triangularly shaped passage area for the signal charged particle beam is an isosceles triangle. As used throughout the specification, the term "isosceles triangle" can refer to a triangle that has two sides of equal length. The two sides of equal length can be referred to as "legs", and the third side can be referred to as "base". In some implementations, at least one of a tip angle and a distance of the base from the optical path or the optical axis can be varied. The variation can be limited by a minimum cross-section around the optical axis, through which the signal charged particles can pass. As an example, the cross-section can be a circle with a diameter equal to a largest center distance (e.g., x=0) between the first electrode and the second electrode. By varying at least one of a tip angle and a distance of the base from the optical path or the optical axis, a hexapole compensation can be maximized. The triangularly shaped passage area of the one or more apertures can be configured by a circle of a radius in a range of 1 to 10 mm, specifically in a range of 2 to 5 mm, and more specifically in a range of 3 to 4 mm around the optical axis defining a leg position together with a tip angle of 45°. In some implementations, the triangularly shaped passage area of the one or more apertures can be further configured by a distance of the base to the optical path or the optical axis being in a range of 1 to 10 mm, specifically in a range of 3 to 7 mm, and more specifically in a range of 5 to 6 mm. As an example, the triangularly shaped passage area of the one or more apertures can be configured by a circle of a radius of 3.5 mm, a tip angle of 45° and a distance of the base to the optical path or the optical axis of 5.5 mm.

In some embodiments, the at least one aperture of the one or more apertures has a first side facing the beam bender and a second side facing away from the beam bender, wherein the first side has the substantially triangularly shaped passage area for the signal charged particle beam, and wherein the second side has a substantially circularly shaped passage area for the signal charged particle beam. As an example, the at least one aperture is positioned at the entry portion of the beam bender. The second side can be provided facing towards the incoming signal charged particle beam.

The term "passage area" as used throughout the specification can be understood as referring to an area of the one or more apertures that has an aperture or through hole provided therein configured for a passage of the signal charged particle beam. The passage area can be an area provided in a plane substantially perpendicular to the optical path. The term "substantially perpendicular" relates to a substantially perpendicular orientation e.g. of the area in which the passage area is provided, and the optical path, wherein a deviation of a few degrees, e.g. up to 10° or even up to 15°, from an exact perpendicular orientation is still considered as a "substantially perpendicular".

According to some embodiments, the first side is configured for minimizing a hexapole component of an electric fringe field, and the second side is configured for minimizing an influence of the electric fringe field on the primary charged particle beam. As an example, the first side is configured for minimizing an influence of the hexapole component of the electric fringe field on the signal charged particle beam.

To minimize the influence of fringe fields, the entrance aperture can have two shapes: A triangular shape facing towards the electrodes of the beam bender that compensates the hexapole, and a circular shape facing e.g. towards the incoming signal charged particles that shields the primary charged particle beam from the deflection fields.

According to some embodiments, which can be combined with other embodiments described herein, the substantially triangularly shaped passage area for the signal charged particle beam is or has a triangularly shaped recess 210 including an aperture opening. Therein, an aperture opening 220 is provided within the triangularly shaped recess 210, as it is shown in FIG. 5. The triangularly shaped recess 210 can be provided facing the beam bender, and in particular the electrodes of the beam bender. The aperture opening 220 can for example be a circular aperture opening. Such a configuration can be beneficial for an aperture being positioned at the entry portion of the beam bender, e.g., the first aperture 200.

According to further embodiments, which can be combined with other embodiments described herein, the substantially triangularly shaped passage area for the signal charged particle beam is or has a substantially triangularly shaped aperture opening 310, as it is shown in FIG. 6. In some implementations, the second side can include a circularly shaped recess 320. The circularly shaped recess 320 can be provided facing away from the beam bender, and in particular away from the electrodes of the beam bender. Such a configuration can be beneficial for an aperture being positioned at the exit portion of the beam bender, e.g., the second aperture 300.

According to some embodiments, which can be combined with other embodiments described herein, the beam bender as described with reference to FIGS. 5 and 6 is further configured to be the same as the beam bender described with reference to FIGS. 3A, 3B and 4 having the differently shaped electrodes. The one or more apertures, as described herein, may be provided in any of the embodiments of the signal charged particle deflection device.

Figure 7:
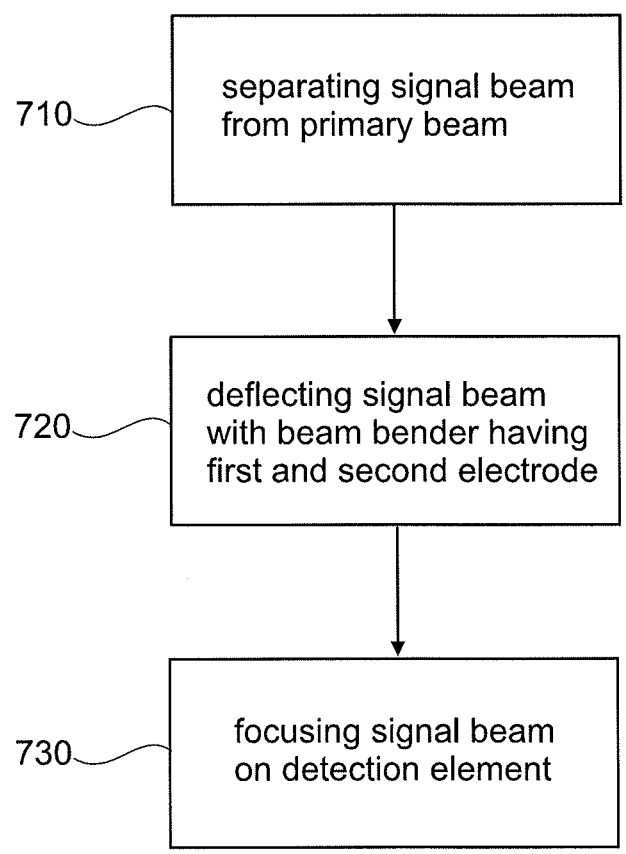
FIG. 7 shows a flow chart of method of detection of a signal charged particle beam in a charged particle beam device according to embodiments described herein.

FIG. 7 shows a flow chart of a method 700 of detection of a signal charged particle beam in a charged particle beam device according to embodiments described herein.

According to some embodiments, the method includes separating a signal charged particle beam from a primary charged particle beam by means of a beam splitter (block 710); deflecting the signal charged particle beam by means of a beam bender, wherein the beam bender includes a first electrode and a second electrode providing an optical path for the signal charged particle beam therebetween, wherein the first electrode has a first cross section in a plane perpendicular to the optical path, and the second electrode has a second cross section in the plane perpendicular to the optical path, and wherein a first part of the first cross section and a second part of the second cross section provide the optical path therebetween, and wherein the first part and the second part are different in shape, in particular wherein the first part and the second part have qualitatively different shapes (block 720); and focusing the signal charged particle beam on at least one detection element by means of a focusing lens (block 730).

In some implementations, the signal charged particle beam is deflected by the beam bender being configured according to the embodiments describe herein, in particular with reference to FIGS. 3 to 6.

According to some further embodiments, the method includes separating a signal charged particle beam from a primary charged particle beam by means of a beam splitter; deflecting the signal charged particle beam by means of a beam bender; and focusing the signal charged particle beam on at least one detection element by means of a focusing lens, wherein the signal charged particle beam enters the beam bender at an entry portion of the beam bender and exits the beam bender at an exit portion of the beam bender, and wherein the signal charged particle beam at least one of enters or exits the beam bender through one or more apertures having a substantially triangularly shaped passage area for the signal charged particle beam.

In some implementations, the signal charged particle beam at least one of enters or exits the beam bender through the one or more apertures being configured according to the embodiments describe herein, in particular with reference to FIGS. 5 and 6.

According to embodiments described herein, the method of detection of a signal charged particle beam in a charged particle beam device can be conducted by means of computer programs, software, computer software products and the interrelated controllers, which can have a CPU, a memory, a user interface, and input and output means being in communication with the corresponding components of the apparatus for processing a large area substrate.

The embodiments of the present disclosure can reduce or compensate a hexapole component of electric fields. The embodiments of the present disclosure can in particular reduce or compensate at least one of a hexapole component between two electrodes of the beam bender of the signal charged particle deflection device (intrinsic hexapole) and the hexapole component of fringe fields e.g. at least one of an entrance and exit of the beam bender. The present disclosure provides improved focusing, angular resolution, detection efficiency, and minimized distortion of the signal charged particle beam.

While the foregoing is directed to embodiments of the disclosure, other and further embodiments of the disclosure may be devised without departing from the basic scope thereof, and the scope thereof is determined by the claims that follow.

The invention claimed is:

1. A signal charged particle deflection device for a charged particle beam device, the signal charged particle deflection device comprising:
    a beam bender configured for deflecting the signal charged particle beam, wherein the beam bender includes a first electrode and a second electrode providing an optical path for the signal charged particle beam therebetween,
    wherein the first electrode has a first cross section in a plane perpendicular to the optical path, and the second electrode has a second cross section in the plane perpendicular to the optical path, and
    wherein a first part of the first cross section and a second part of the second cross section provide the optical path therebetween, and wherein the first part and the second part are different in shape.

2. The signal charged particle deflection device of claim 1, wherein the first part of the first cross section is defined by a polynomial.

3. The signal charged particle deflection device of claim 2, wherein at least a portion of an electrode surface of the first electrode is defined by a rotation of the polynomial around a first axis.

4. The signal charged particle deflection device of claim 1, wherein the second part of the second cross section is defined by an exponential function.

5. The signal charged particle deflection device of claim 4, wherein at least a portion of an electrode surface of the second electrode is defined by a rotation of the exponential function around a second axis.

6. The signal charged particle deflection device of claim 1, wherein the first part of the first cross section and the second part of the second cross section are configured for minimizing a hexapole component of an electric field between the first electrode and the second electrode.

7. A signal charged particle deflection device for a charged particle beam device, the signal charged particle deflection device comprising:
    a beam bender configured for deflecting the signal charged particle beam, the beam bender having an entry portion for the signal charged particle beam and an exit portion for the signal charged particle beam; and
    one or more apertures having a substantially triangularly shaped passage area for the signal charged particle beam, wherein at least one aperture of the one or more apertures is positioned at the entry portion or the exit portion of the beam bender.

8. The signal charged particle deflection device of claim 7, wherein a first aperture of the one or more apertures is positioned at the entry portion of the beam bender and a second aperture of the one or more apertures is positioned at the exit portion of the beam bender.

9. The signal charged particle deflection device of claim 7, wherein the substantially triangularly shaped passage area for the signal charged particle beam is an isosceles triangle.

10. The signal charged particle deflection device of claim 7, wherein the at least one aperture of the one or more apertures has a first side facing the beam bender and a second side facing away from the beam bender, wherein the first side has the substantially triangularly shaped passage area for the signal charged particle beam, and wherein the second side has a substantially circularly shaped passage area for the signal charged particle beam.

11. The signal charged particle deflection device of claim 10, wherein the first side is configured for minimizing a hexapole component of an electric fringe field, and wherein the second side is configured for minimizing an influence of the electric fringe field on the primary charged particle beam.

12. The signal charged particle deflection device of claim 7, wherein the substantially triangularly shaped passage area for the signal charged particle beam is a substantially triangularly shaped aperture opening, or wherein the substantially triangularly shaped passage area for the signal charged particle beam is a triangularly shaped recess including an aperture opening.

13. The signal charged particle deflection device of claim 1, further comprising one or more apertures having a substantially triangularly shaped passage area for the signal charged particle beam, wherein at least one aperture of the one or more apertures is positioned at an entry portion or an exit portion of the beam bender.

14. The signal charged particle deflection device of claim 7, wherein the beam bender includes a first electrode and a second electrode providing an optical path for the signal charged particle beam therebetween,
    wherein the first electrode has a first cross section in a plane perpendicular to the optical path, and the second electrode has a second cross section in the plane perpendicular to the optical path, and
    wherein a first part of the first cross section and a second part of the second cross section provide the optical path therebetween, and wherein the first part and the second part are different in shape.

15. A signal charged particle detection system for a charged particle beam device, the signal charged particle detection system comprising:
    a beam splitter for separating a primary charged particle beam and a signal charged particle beam formed upon impact on a specimen;
    a signal charged particle deflection device of claim 1;
    a focusing lens for focusing the signal charged particle beam; and
    at least one detection element for detecting the signal charged particle beam.

16. A charged particle beam device, comprising a signal charged particle deflection device of claim 1.

17. A method of detection of a signal charged particle beam in a charged particle beam device, the method comprising:
    separating a signal charged particle beam from a primary charged particle beam by means of a beam splitter;
    deflecting the signal charged particle beam by means of a beam bender, wherein the beam bender includes a first electrode and a second electrode providing an optical path for the signal charged particle beam therebetween, wherein the first electrode has a first cross section in a plane perpendicular to the optical path, and the second electrode has a second cross section in the plane perpendicular to the optical path, and wherein a first part of the first cross section and a second part of the second cross section provide the optical path therebetween, and wherein the first part and the second part are different in shape; and focusing the signal charged particle beam on at least one detection element by means of a focusing lens.

18. A method of detection of a signal charged particle beam in a charged particle beam device, the method comprising:

separating a signal charged particle beam from a primary charged particle beam by means of a beam splitter;

deflecting the signal charged particle beam by means of a beam bender; and focusing the signal charged particle beam on at least one detection element by means of a focusing lens, wherein the signal charged particle beam enters the beam bender at an entry portion of the beam bender and exits the beam bender at an exit portion of the beam bender, and wherein the signal charged particle beam at least one of enters or exits the beam bender through one or more apertures having a substantially triangularly shaped passage area for the signal charged particle beam.

19. The method of claim 17, wherein the signal charged particle beam is deflected by a beam bender configured for deflecting the signal charged particle beam, wherein the beam bender includes a first electrode and a second electrode providing an optical path for the signal charged particle beam therebetween, wherein the first electrode has a first cross section in a plane perpendicular to the optical path, and the second electrode has a second cross section in the plane perpendicular to the optical path, and wherein a first part of the first cross section and a second part of the second cross section provide the optical path therebetween, and wherein the first part and the second part are different in shape.

20. The method of claim 18, wherein the signal charged particle beam at least one of enters or exits the beam bender through one or more apertures, the one or more apertures having a substantially triangularly shaped passage area for the signal charged particle beam, wherein at least one aperture of the one or more apertures is positioned at the entry portion or the exit portion of the beam bender.

* * * * *